US 9,961,808 B2
May 1, 2018

(12) United States Patent
Lei et al.

(10) Patent No.: US 9,961,808 B2
(45) Date of Patent: May 1, 2018

(54) POWER ELECTRONICS SYSTEM

(71) Applicant: Ford Global Technologies, LLC, Dearborn, MI (US)

(72) Inventors: Guangyin Lei, Dearborn Heights, MI (US); Michael W. Degner, Novi, MI (US); Edward Chan-Jiun Jih, Troy, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days. days.

(21) Appl. No.: 15/065,309

(22) Filed: Mar. 9, 2016

(65) Prior Publication Data
US 2017/0265337 A1  Sep. 14, 2017

(51) Int. Cl.
H05K 7/20 (2006.01)
H02M 7/00 (2006.01)
H02M 7/5387 (2007.01)

(52) U.S. Cl.
CPC ........ *H05K 7/20927* (2013.01); *H02M 7/003* (2013.01); *H02M 7/5387* (2013.01)

(58) Field of Classification Search
CPC ............. H05K 7/2089; H05K 7/20254; H05K 7/20845; H05K 7/20218; H01L 23/473; H01L 2023/4025; F28F 3/08; F28F 3/083; F28F 3/086; F28F 3/12
USPC .......... 361/696–710; 165/80.4, 80.5, 104.33; 438/122
See application file for complete search history.

(56) References Cited

U.S. PATENT DOCUMENTS

| | | | |
|---|---|---|---|
| 3,648,113 A | 3/1972 | Rathjen et al. | |
| 4,186,422 A | 1/1980 | Laermer | |
| 5,125,451 A | 6/1992 | Matthews | |
| 5,170,319 A | 12/1992 | Chao-Fan Chu et al. | |
| 6,329,089 B1 | 12/2001 | Roberts et al. | |
| 7,200,007 B2 | 4/2007 | Yasui et al. | |
| 7,835,151 B2 * | 11/2010 | Olesen | H01L 23/473 165/121 |
| 8,418,751 B2 | 4/2013 | Bezama et al. | |
| 8,537,551 B2 * | 9/2013 | Ide | H01L 23/473 257/706 |
| 8,895,173 B2 | 11/2014 | Gandhi et al. | |
| 8,971,041 B2 | 3/2015 | Sharaf et al. | |
| 2003/0132040 A1 | 7/2003 | Radosevich et al. | |
| 2005/0030717 A1 | 2/2005 | Inagaki et al. | |
| 2005/0259402 A1 | 11/2005 | Yasui et al. | |
| 2008/0251909 A1 | 10/2008 | Tokuyama et al. | |
| 2009/0146293 A1 | 6/2009 | Olesen | |
| 2011/0316143 A1 | 12/2011 | Noritake et al. | |
| 2011/0318884 A1 | 12/2011 | Noritake et al. | |
| 2012/0001341 A1 | 1/2012 | Ide et al. | |
| 2013/0003301 A1 | 1/2013 | Miyamoto et al. | |

(Continued)

*Primary Examiner* — Mukund G Patel
(74) *Attorney, Agent, or Firm* — David Kelley; Brooks Kushman, P.C.

(57) ABSTRACT

A power-electronics assembly includes a plurality of power modules each having a body, a power stage disposed in the body and having opposing major sides, and a coolant channel defined in the body at a location adjacent to one of the major sides. The modules are arranged in a stack such that the coolant channels are interleaved with the power stages. At least one of the bodies defines a passageway extending between adjacent channels to connect the adjacent channels in fluid communication.

19 Claims, 11 Drawing Sheets

(56) References Cited

U.S. PATENT DOCUMENTS

| | | | |
|---|---|---|---|
| 2013/0335920 A1* | 12/2013 | Murata | H05K 7/20236 |
| | | | 361/699 |
| 2014/0198453 A1 | 7/2014 | Lhang et al. | |
| 2014/0340845 A1 | 11/2014 | Straznicky et al. | |
| 2015/0348869 A1 | 12/2015 | Joshi et al. | |
| 2017/0040241 A1 | 2/2017 | Yoshida | |
| 2017/0259672 A1 | 9/2017 | Lei et al. | |
| 2017/0259691 A1 | 9/2017 | Lei et al. | |

* cited by examiner

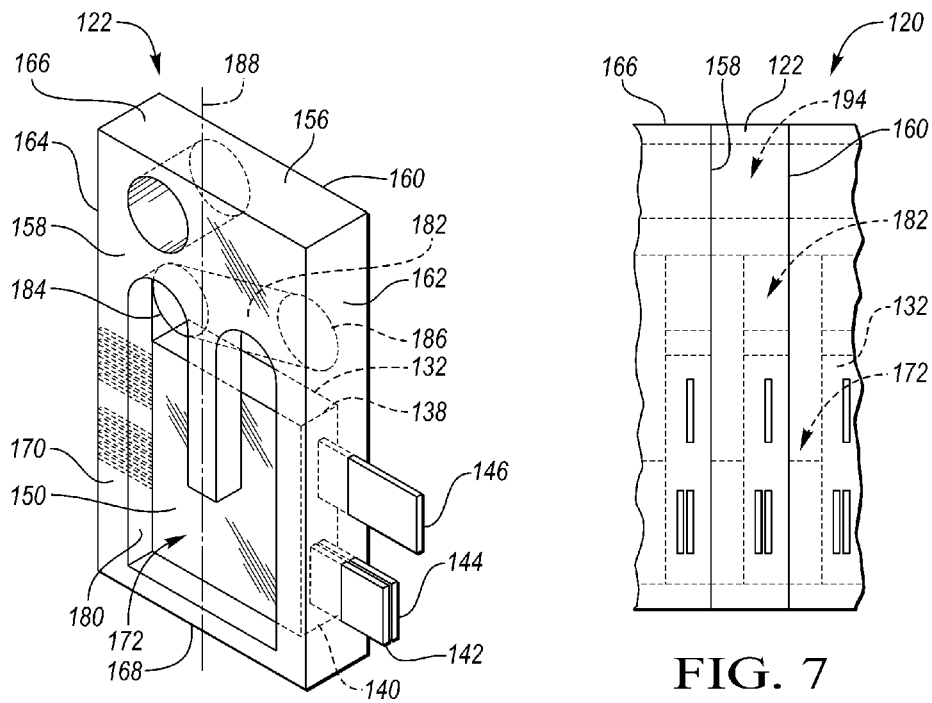
FIG. 6A
FIG. 7
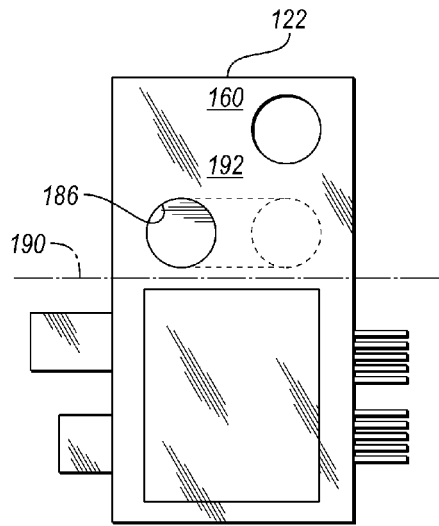
FIG. 6B
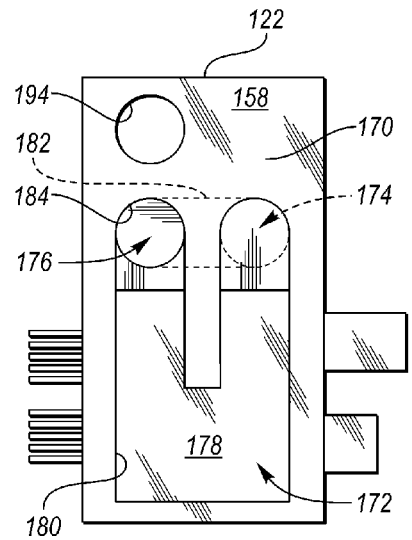
FIG. 6C

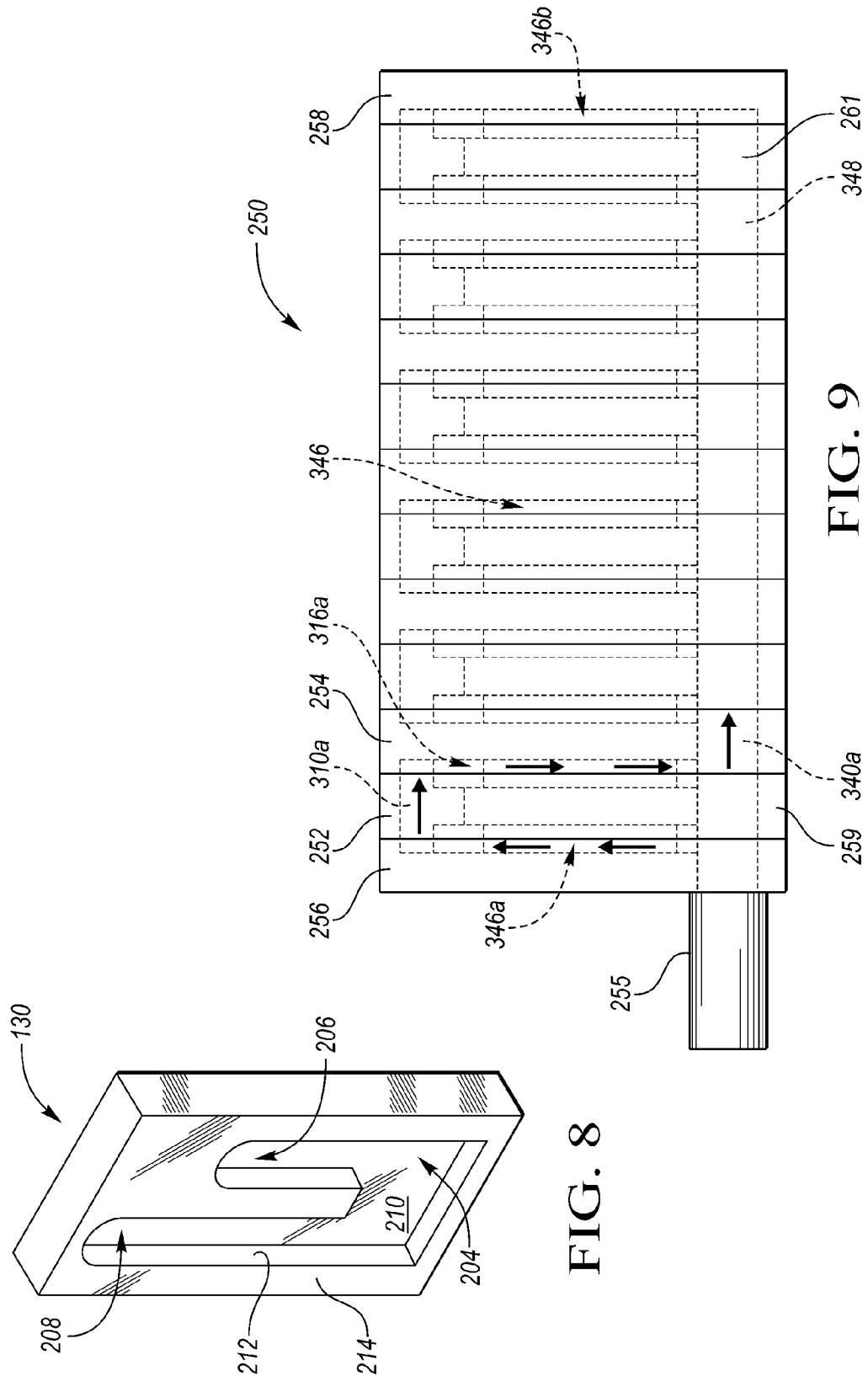

POWER ELECTRONICS SYSTEM

TECHNICAL FIELD

The present disclosure relates to power electric systems for an electric drivetrain of an automobile.

BACKGROUND

Vehicles such as battery-electric vehicles (BEVs), plug-in hybrid electric vehicles (PHEVs) and fully hybrid-electric vehicles (FHEVs) contain a traction battery assembly to act as an energy source for one or more electric machines. The traction battery includes components and systems to assist in managing vehicle performance and operations. A power inverter is electrically connected between the battery and the electric machines to convert the direct current coming from the battery into alternating current compatible with the electric machines. The power inverter may also act as a rectifier to convert alternating current from the electric machines to direct current compatible with the battery.

SUMMARY

According to one embodiment, a power-electronics assembly includes a plurality of power modules each having a body, a power stage disposed in the body and having opposing major sides, and a coolant channel defined in the body at a location adjacent to one of the major sides. The modules are arranged in a stack such that the coolant channels are interleaved with the power stages. At least one of the bodies defines a passageway extending between adjacent channels to connect the adjacent channels in fluid communication.

According to another embodiment, a power-electronics assembly includes a plurality of power modules each having a power stage disposed within a body. The body has a back, and a front defining a fluid channel having a floor that defines a first port fluidly connected to a second port defined in the back via a passageway extending between the first and second ports. The modules are stacked such that fluid exiting one of the second ports immediately enters one of the fluid channels.

According to yet another embodiment, a power-module assembly for a power inverter includes first and second power modules each having a power stage encased in a body that has front and back sides. The power modules are arranged in a stack such that the back side of the first power module is disposed against the front side of the second power module. A coolant chamber is recessed into at least one of the bodies, disposed between the power stages, and arranged to circulate fluid to cool the power stages. Each of the bodies also defines a passageway extending between the front and back sides and having a port opening into the coolant chamber.

BRIEF DESCRIPTION OF THE DRAWINGS

FIG. 6A is a perspective view of a power module according to one embodiment.

FIG. 6B is a back view of the power module of FIG. 6A.

FIG. 6C is a front view of the power module of FIG. 6A.

FIG. 7 is a side view of a portion of the power-module assembly of FIG. 4.

FIG. 8 is a perspective view of an end cap of the power-module assembly of FIG. 4.

FIG. 9 is a side view of another power-module assembly.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
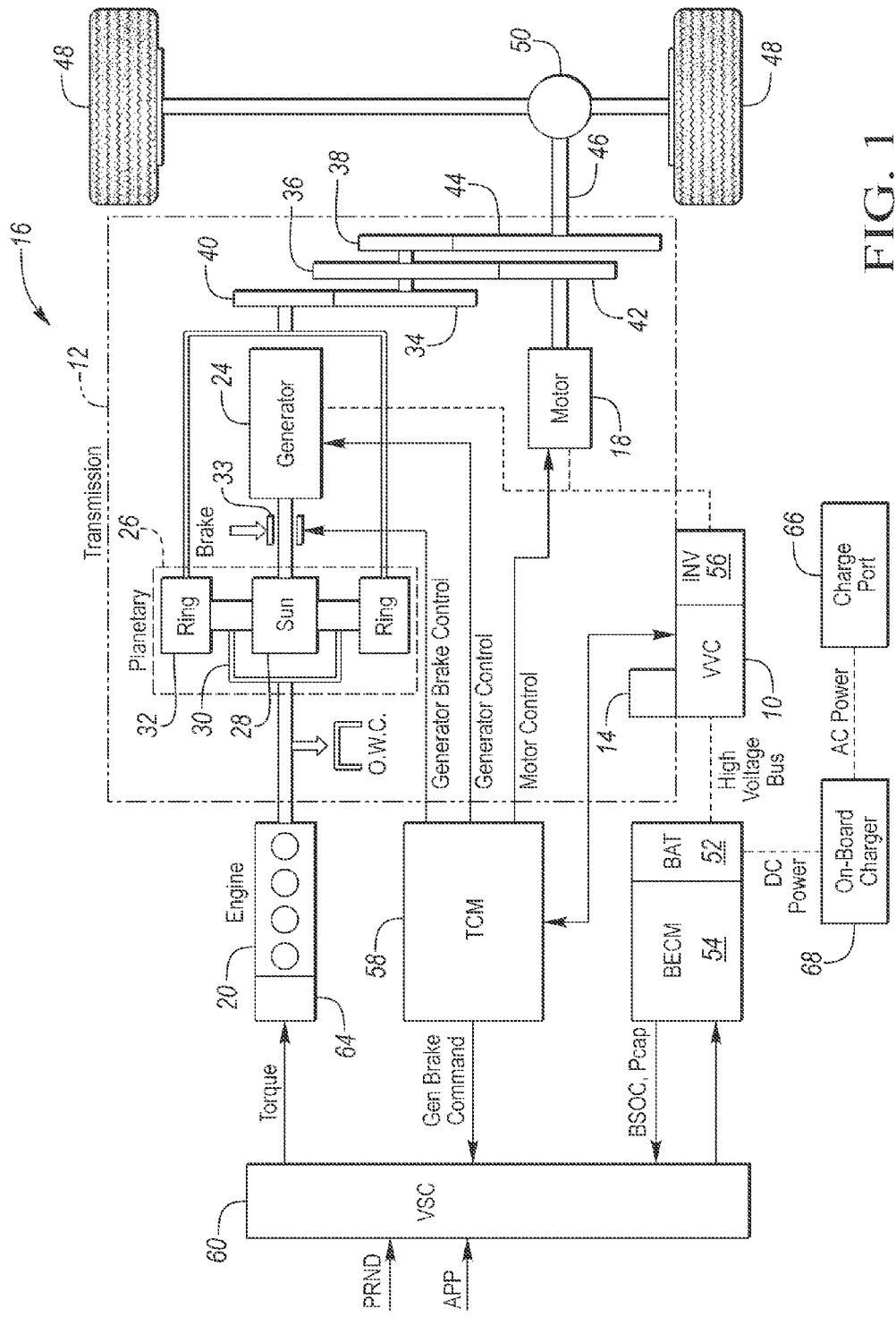
FIG. 1 is a schematic diagram of an example hybrid vehicle.

An example of a PHEV is depicted in FIG. 1 and referred to generally as a vehicle 16. The vehicle 16 includes a transmission 12 and is propelled by at least one electric machine 18 with assistance from an internal combustion engine 20. The electric machine 18 may be an alternating current (AC) electric motor depicted as "motor" 18 in FIG. 1. The electric machine 18 receives electrical power and provides torque for vehicle propulsion. The electric machine 18 also functions as a generator for converting mechanical power into electrical power through regenerative braking.

The transmission 12 may be a power-split configuration. The transmission 12 includes the first electric machine 18 and a second electric machine 24. The second electric machine 24 may be an AC electric motor depicted as "generator" 24 in FIG. 1. Like the first electric machine 18, the second electric machine 24 receives electrical power and provides output torque. The second electric machine 24 also functions as a generator for converting mechanical power into electrical power and optimizing power flow through the transmission 12. In other embodiments, the transmission does not have a power-split configuration.

The transmission 12 may include a planetary gear unit 26, which includes a sun gear 28, a planet carrier 30, and a ring gear 32. The sun gear 28 is connected to an output shaft of the second electric machine 24 for receiving generator torque. The planet carrier 30 is connected to an output shaft of the engine 20 for receiving engine torque. The planetary gear unit 26 combines the generator torque and the engine torque and provides a combined output torque about the ring gear 32. The planetary gear unit 26 functions as a continuously variable transmission, without any fixed or "step" ratios.

The transmission 12 may also include a one-way clutch (O.W.C.) and a generator brake 33. The O.W.C. is coupled to the output shaft of the engine 20 to only allow the output shaft to rotate in one direction. The O.W.C. prevents the transmission 12 from back-driving the engine 20. The generator brake 33 is coupled to the output shaft of the second electric machine 24. The generator brake 33 may be activated to "brake" or prevent rotation of the output shaft of the second electric machine 24 and of the sun gear 28. Alternatively, the O.W.C. and the generator brake 33 may be eliminated and replaced by control strategies for the engine 20 and the second electric machine 24.

The transmission 12 may further include a countershaft having intermediate gears including a first gear 34, a second gear 36 and a third gear 38. A planetary output gear 40 is connected to the ring gear 32. The planetary output gear 40 meshes with the first gear 34 for transferring torque between the planetary gear unit 26 and the countershaft. An output gear 42 is connected to an output shaft of the first electric machine 18. The output gear 42 meshes with the second gear 36 for transferring torque between the first electric machine 18 and the countershaft. A transmission output gear 44 is connected to a driveshaft 46. The driveshaft 46 is coupled to a pair of driven wheels 48 through a differential 50. The transmission output gear 44 meshes with the third gear 38 for transferring torque between the transmission 12 and the driven wheels 48.

The vehicle 16 includes an energy storage device, such as a traction battery 52 for storing electrical energy. The battery 52 is a high-voltage battery that is capable of outputting electrical power to operate the first electric machine 18 and the second electric machine 24. The battery 52 also receives electrical power from the first electric machine 18 and the second electric machine 24 when they are operating as generators. The battery 52 is a battery pack made up of several battery modules (not shown), where each battery module contains a plurality of battery cells (not shown). Other embodiments of the vehicle 16 contemplate different types of energy storage devices, such as capacitors and fuel cells (not shown) that supplement or replace the battery 52.

A high-voltage bus electrically connects the battery 52 to the first electric machine 18 and to the second electric machine 24.

The vehicle includes a battery energy control module (BECM) 54 for controlling the battery 52. The BECM 54 receives input that is indicative of vehicle conditions and battery conditions, such as battery temperature, voltage and current. The BECM 54 calculates and estimates battery parameters, such as battery state of charge and the battery power capability. The BECM 54 provides output (BSOC, $P_{cap}$) that is indicative of a battery state of charge (BSOC) and a battery power capability ($P_{cap}$) to other vehicle systems and controllers.

The vehicle 16 includes a DC-DC converter or variable voltage converter (VVC) 10 and an inverter 56. The VVC 10 and the inverter 56 are electrically connected between the traction battery 52 and the first electric machine 18, and between the battery 52 and the second electric machine 24. The VVC 10 "boosts" or increases the voltage potential of the electrical power provided by the battery 52. The VVC 10 also "bucks" or decreases the voltage potential of the electrical power provided to the battery 52, according to one or more embodiments. The inverter 56 inverts the DC power supplied by the main battery 52 (through the VVC 10) to AC power for operating the electric machines 18, 24. The inverter 56 also rectifies AC power provided by the electric machines 18, 24, to DC for charging the traction battery 52. Other embodiments of the transmission 12 include multiple inverters (not shown), such as one inverter associated with each electric machine 18, 24. The VVC 10 includes an inductor assembly 14.

The transmission 12 includes a transmission control module (TCM) 58 for controlling the electric machines 18, 24, the VVC 10 and the inverter 56. The TCM 58 is configured to monitor, among other things, the position, speed, and power consumption of the electric machines 18, 24. The TCM 58 also monitors electrical parameters (e.g., voltage and current) at various locations within the VVC 10 and the inverter 56. The TCM 58 provides output signals corresponding to this information to other vehicle systems.

The vehicle 16 includes a vehicle system controller (VSC) 60 that communicates with other vehicle systems and controllers for coordinating their function. Although it is shown as a single controller, the VSC 60 may include multiple controllers that may be used to control multiple vehicle systems according to an overall vehicle control logic, or software.

The vehicle controllers, including the VSC 60 and the TCM 58 generally includes any number of microprocessors, ASICs, ICs, memory (e.g., FLASH, ROM, RAM, EPROM and/or EEPROM) and software code to co-act with one another to perform a series of operations. The controllers also include predetermined data, or "look up tables" that are based on calculations and test data and stored within the memory. The VSC 60 communicates with other vehicle systems and controllers (e.g., the BECM 54 and the TCM 58) over one or more wired or wireless vehicle connections using common bus protocols (e.g., CAN and LIN). The VSC 60 receives input (PRND) that represents a current position of the transmission 12 (e.g., park, reverse, neutral or drive). The VSC 60 also receives input (APP) that represents an accelerator pedal position. The VSC 60 provides output that represents a desired wheel torque, desired engine speed, and generator brake command to the TCM 58; and contactor control to the BECM 54.

The vehicle 16 includes an engine control module (ECM) 64 for controlling the engine 20. The VSC 60 provides output (desired engine torque) to the ECM 64 that is based on a number of input signals including APP, and corresponds to a driver's request for vehicle propulsion.

If the vehicle 16 is a PHEV, the battery 52 may periodically receive AC energy from an external power supply or grid, via a charge port 66. The vehicle 16 also includes an on-board charger 68, which receives the AC energy from the charge port 66. The charger 68 is an AC/DC converter which converts the received AC energy into DC energy suitable for charging the battery 52. In turn, the charger 68 supplies the DC energy to the battery 52 during recharging. Although illustrated and described in the context of a PHEV 16, it is understood that the inverter 56 may be implemented on other types of electric vehicles, such as a HEV or a BEV.

Figure 2:
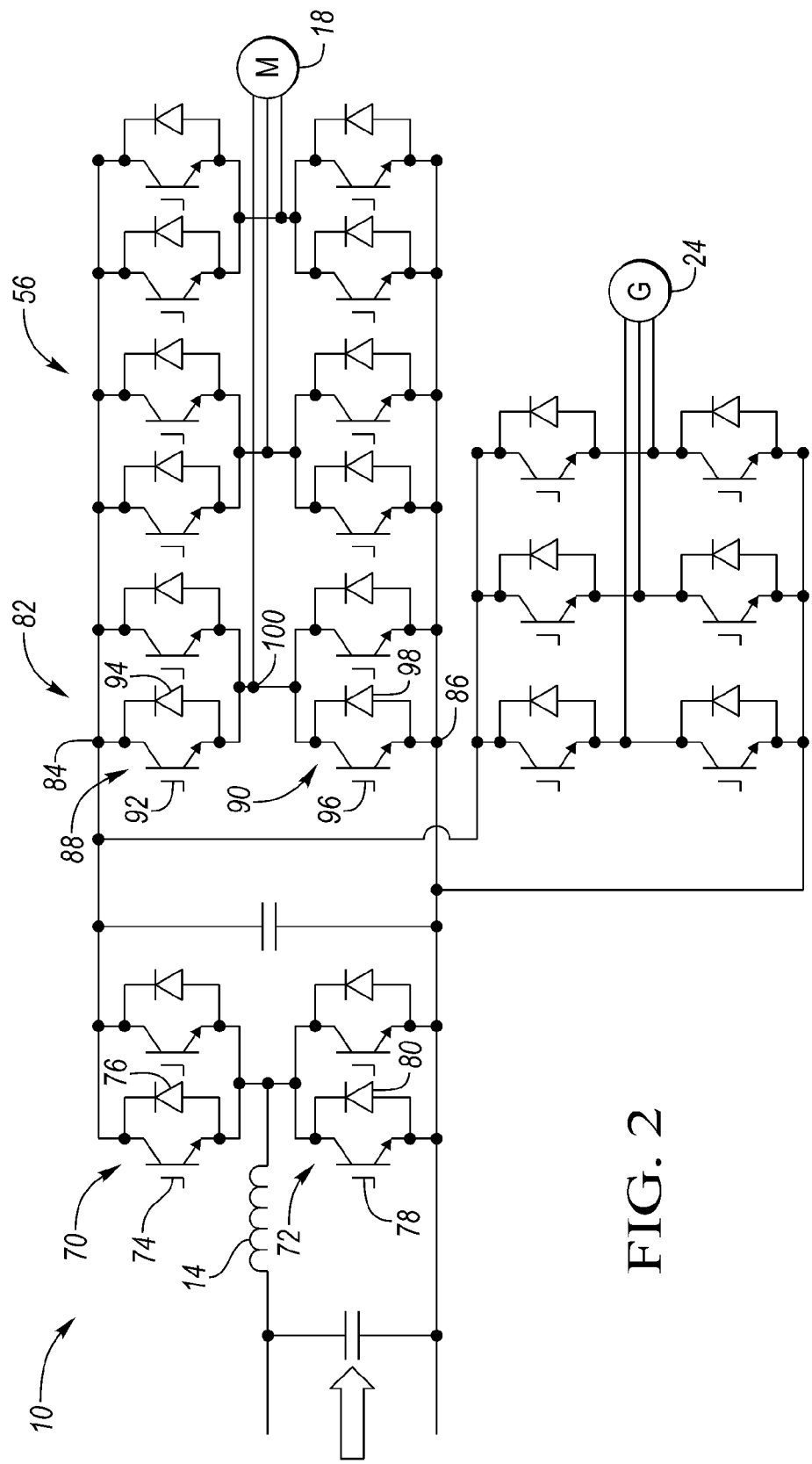
FIG. 2 is a schematic diagram of a variable voltage converter and a power inverter.

Referring to FIG. 2, an electrical schematic of the VVC 10 and the inverter 56 is shown. The VVC 10 may include a one or more power stages having a transistor-based switching arrangement, such as a half bridge. Each power stage includes a first switching unit 70 and a second switching unit 72 for boosting the input voltage ($V_{bat}$) to provide output voltage ($V_{dc}$). The first switching unit 70 may include a first transistor 74 connected in parallel to a first diode 76, but with their polarities switched (anti-parallel). The second switching unit 72 may include a second transistor 78 connected anti-parallel to a second diode 80. Each transistor 74, 78 may be any type of controllable switch (e.g., an insulated gate bipolar transistor (IGBT) or field-effect transistor (FET)). Additionally, each transistor 74, 78 may be individually controlled by the TCM 58. The inductor assembly 14 is depicted as an input inductor that is connected in series between the traction battery 52 and the switching units 70, 72. The inductor 14 generates magnetic flux when a current is supplied. When the current flowing through the inductor 14 changes, a time-varying magnetic field is created, and a voltage is induced. Other embodiments of the VVC 10 include alternative circuit configurations.

The inverter 56 may include a plurality of power stages having a transistor-based switching arrangement, such as a half-bridge that are stacked in an assembly. Each of the half bridges may include a positive DC lead 84 that is coupled to a positive DC node from the battery and a negative DC lead 86 that is coupled to a negative DC node from the battery. Each of the half bridges 82 may also include a first switching unit 88 and a second switching unit 90. The first switching unit 88 may include a first transistor 92 connected in anti-parallel to a first diode 94. The second switching unit 90 may include a second transistor 96 connected in anti-parallel to a second diode 98. The first and second transistors 92, 96 may be IGBTs or FETs. The first and second switching units 88, 90 of the each of the half-bridges 82 convert the DC power of the battery into a single phase AC output at the AC lead 100. Each of the AC leads 100 are electrically connected to the motor 18 or generator 24.

In the illustrated embodiment, the VVC 10 includes two power stages and the inverter includes 9 power stages (three for the generator 24 and six for the motor 18). In other embodiments, the VVC 10 includes one power stage and the inverter includes six power stages (three for the generator 24 and three for the motor 18). The VVC power stages and the inverter power stages may be identical components and generally referred to as power stages 82. Both the VVC power stages and the inverter power stages may be arranged in a common stack.

Figure 3:
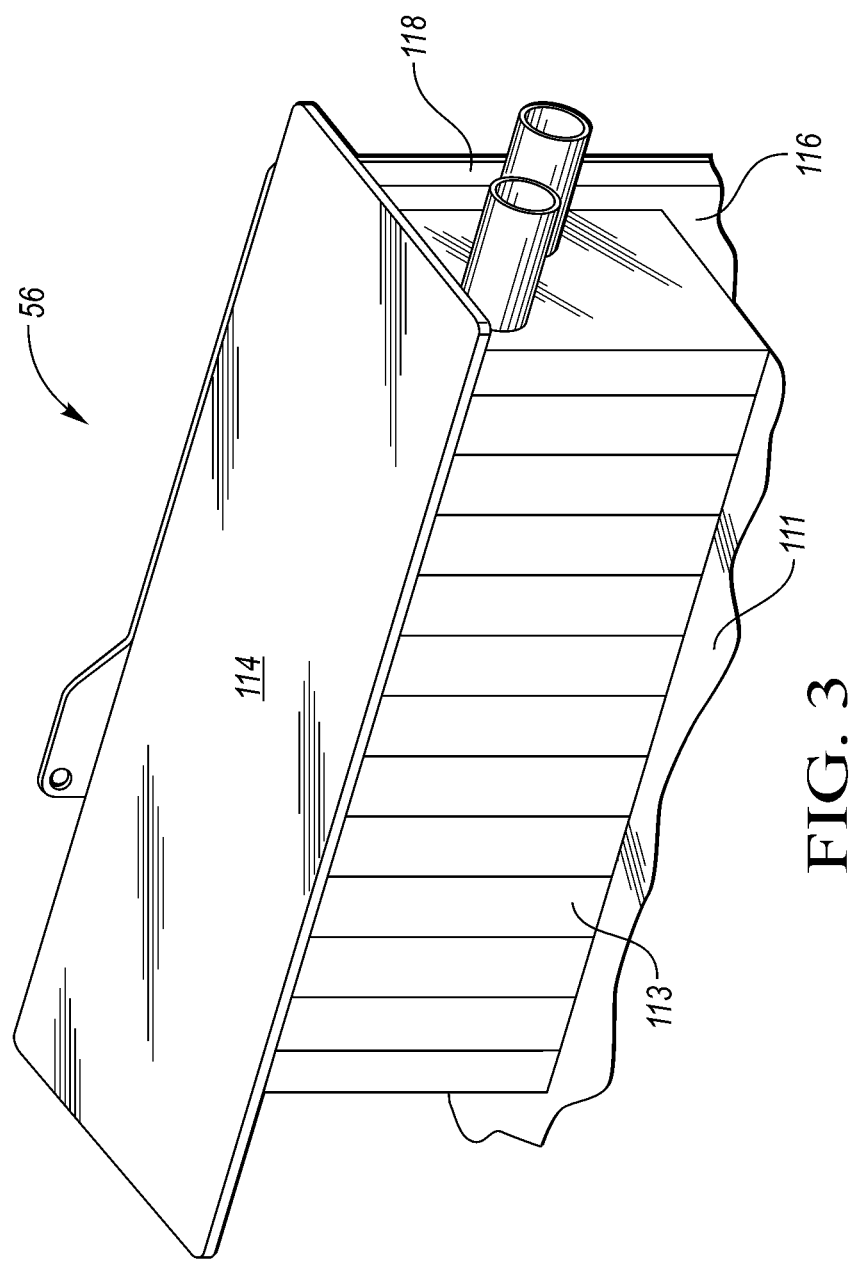
FIG. 3 is a perspective view of a power inverter.

Referring to FIG. 3, the vehicle power inverter 56 may be mounted on a vehicle component 111, such as a body structure, frame member, or powertrain component. The power inverter 56 may include a power-module assembly 113 that is electrically connected with a gate drive board 114, a capacitor bank 116, and a control board 118. The power-module assembly 113 may include a plurality of power modules stacked in an array and each having one or more half bridges packaged in a power stage.

Figure 4:
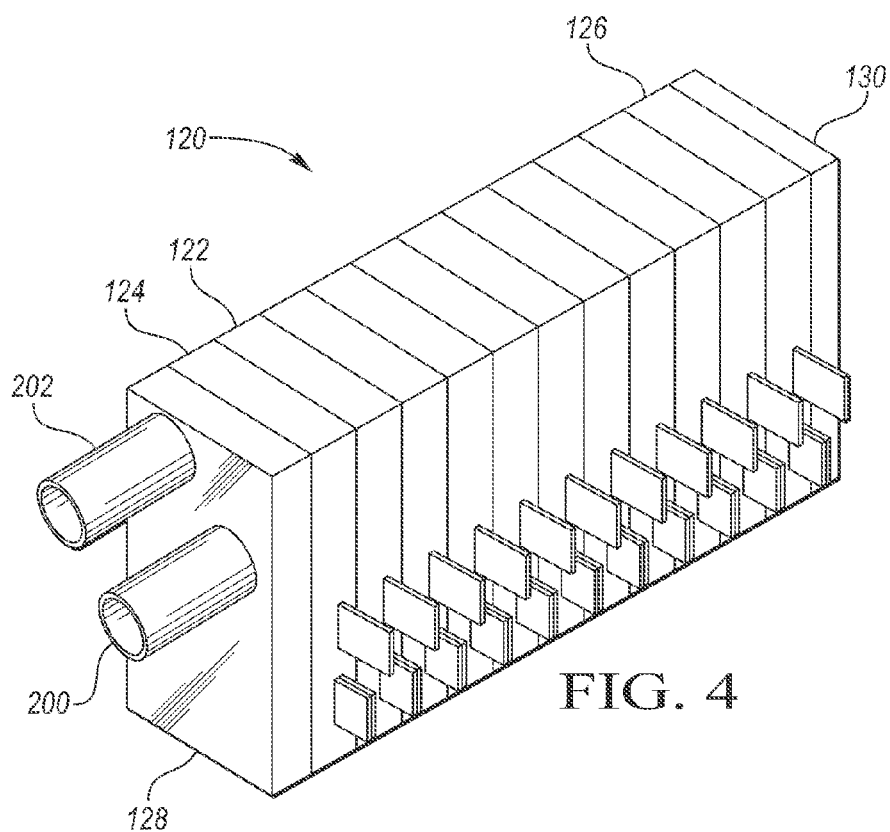
FIG. 4 is a perspective view of a power-module assembly for a power inverter.

FIGS. 4 to 19 and the related discussion describe example power-module assemblies and their individual components. The power-module assemblies may be part of a power-electronics system (such as a power inverter). Referring to FIG. 4, an example power-module assembly 120 includes a plurality of power modules 122 arranged in a stack. The power-module assembly 120 includes a first power module 124 defining one end of the stack and a last power module 126 defining the other end of the stack. A first endplate 128 is disposed against the first module 124, and a second endplate 130 is disposed against the last module 126. The endplates cooperate to sandwich the stack and may provide compression to help hold the stack together. The power-module assembly 120 may be secured together by adhesive, bracketry, or fasteners extending through the power-module assembly. The power modules 122 may all be a same power module, or the power-modules assembly 120 may include two or more sets of power modules that are different.

Figure 5:
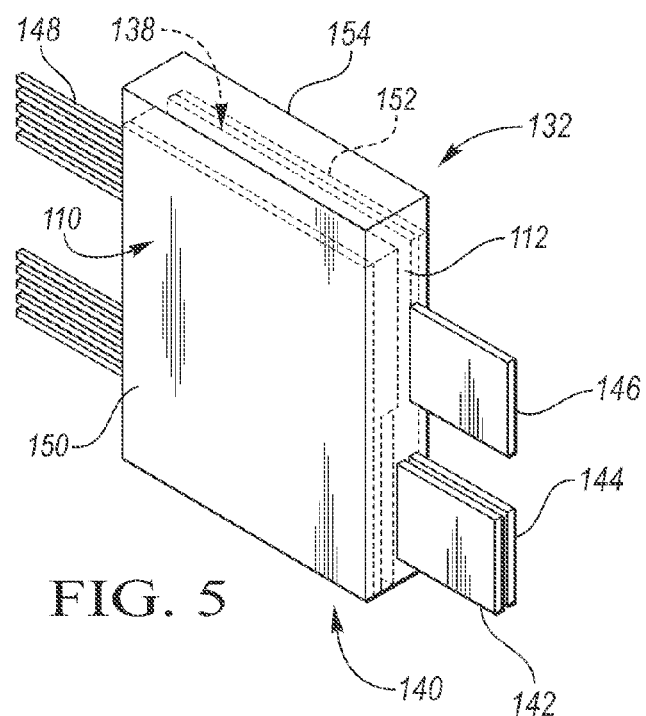
FIG. 5 is a perspective view of a power stage.
Figure 10A:
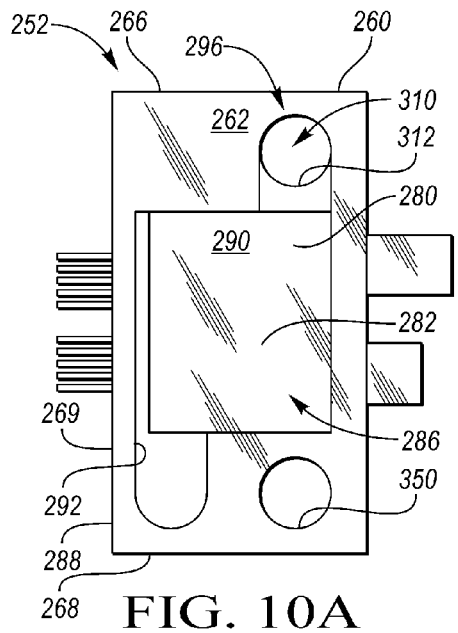
FIG. 10A is a front view of one of power modules of the first set of modules of the assembly of FIG. 9.
Figure 10B:
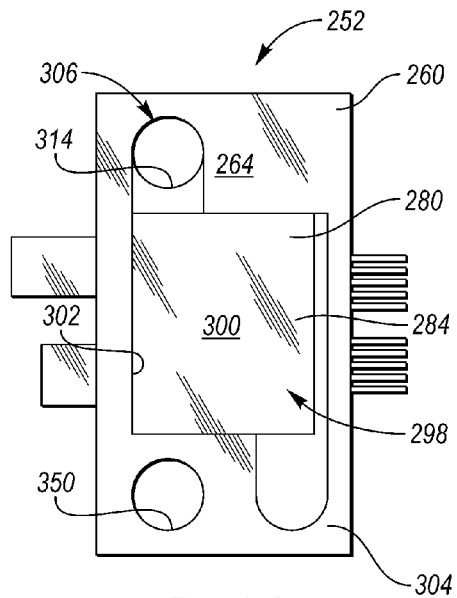
FIG. 10B is a back view of one of the power modules of the first set.
Figure 11A:
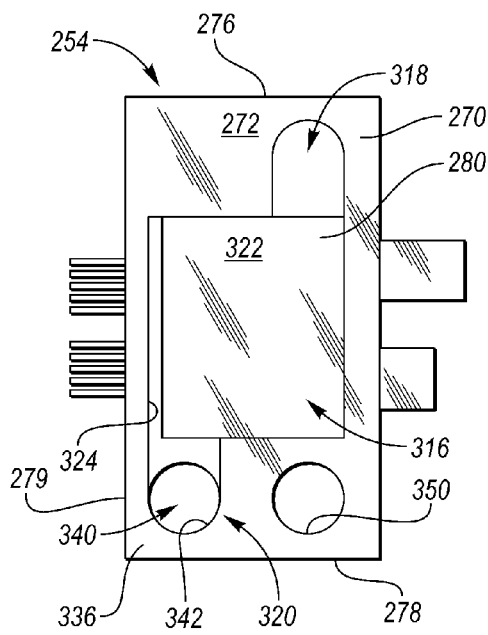
FIG. 11A is a front view of one of power modules of the second set of modules of the assembly of FIG. 9.
Figure 11B:
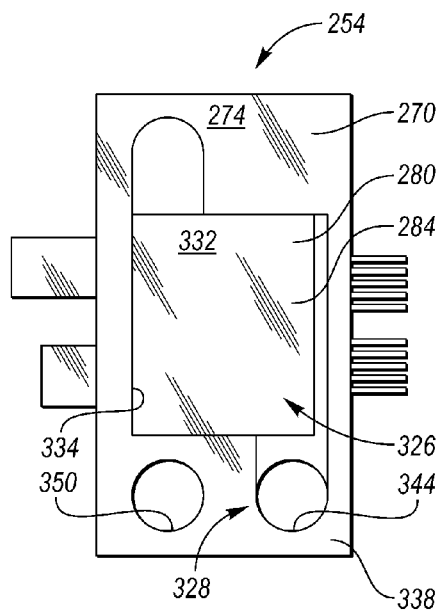
FIG. 11B is a back view of one of the power modules of the second set.

Referring to FIG. 5, each of the power modules 122 includes a power stage 132 that contains the semiconductor devices. Each of the power stages 132 may include opposing major sides 110, opposing minor sides 112, a top 138, and a bottom 140. The power stage 132 also includes a positive DC power terminal 142, a negative DC power terminal 144, an AC power terminal 146, and signal pins 148 that are electrically connected with the semiconductor devices of the power stage 132. The location of the terminals and signal pins may vary by embodiment and are not limited to the configuration shown. For example, the signal pins 148 may be on the left minor side and the terminal 142, 144, and 146 may be on the right minor side. A first plate 150 defines the outer surface of one of the major sides 110 and a second plate 152 defines the other of the major sides 110 of the power stage 132. The plates 150, 152 may be metallic, plastic, composite, or a combination thereof. The semiconductor devices of the power stage 132 may be filled with an epoxy 154 or other filler to electrically isolate the semiconductor devices from the plates and other components.

Referring to FIGS. 4, 6A-6C, and 7, each of the power modules 122 may include a body 156 having a front 158, a back 160, a right side 162, a left side 164, a top 166, and a bottom 168 that are interconnected along edges. The power stage 132 is at least partially disposed within the body. The body 156 may be a polymer or epoxy that encapsulates the power stage 132. Portions of the power stage 132 may be exposed through one or more sides of the body 156. For example, the terminals and the signal pins may extend through the left and right sides 162, 164, and the major sides 110 may be exposed through the front and back 158, 160.

The power modules 122 may be arranged in the stack with the front 158 of one modules 122 disposed against the back of an adjacent module, and with the back 160 disposed against the front of another adjacent module. A gasket or other sealing means may be disposed between abutting modules to seal the stack.

A coolant circuit may be defined within the power module 122 to circulate coolant (such as an ethylene glycol mixture) across the power stages 132 to cool the semiconductor devices. The endplates 128, 130, and the power modules 122 include ports, passageways, and channels that interconnect in fluid communication to form the coolant circuit. The coolant circuit may be arranged in parallel, series, or a combination of both.

The power module 122 illustrated in FIGS. 6A-6C is designed for a series coolant circuit. In the illustrated example, the power modules 122 are all the same (i.e., designed to be identical). Each power module 122 may define a coolant channel 172 defined by the front 158. The coolant channel 172 includes a floor 178 and a sidewall 180 extending between the outer surface 170 of the front 158 and the floor 178. The power stage 132 may be arranged in the body 156 such that a portion of the floor 178 is formed by the first plate 150. This allows the coolant to circulator directly across the first plate to increase cooling efficiency by removing thermal resistance between the coolant and the power stage 132.

The coolant channel 172 may also include a first end 174 and a second end 176. The first end 174 is the coolant receiving area and is the location where the coolant enters into the channel 172. A crossover passageway 182 is defined within the body 156 and extends between the front 158 and the back 160 to connect adjacent coolant channels in fluid communication. Note: the floor 178 is considered to be part of the front 158 even though it is recessed inwardly from the outer most surface 170 of the front. The crossover passageway 182 includes an entrance port 184 defined by the floor 178 near the second end 176 of the channel, and an exit port 186 defined by the back 160. The passageway 182 extends diagonally (i.e., the passageway extends through the body at an oblique angle relative to the front or back) through the body 156 such that the entrance and exit ports 184, 186 are axially offset relative to each other to place the ports on opposite sides of the longitudinal centerline 188 of the body 156. In other embodiments, the passageway 182 may extend diagonally such that the ports are on opposite sides of the latitudinal centerline 190 of the body 156. The diagonally extending passageway 182 allows the coolant to enter and exit each of the modules 122 on a same side of the centerline 188. In the illustrated embodiment, the exit port 186 is axially aligned with the coolant receiving area (first end) 174. This allows for all the power modules 122 to all be the same, which may reduce costs.

Each of the exit ports 186 are disposed next to the first end 174 of the adjacent coolant channel. The backs 160 may be substantially flat or may include channeling that matches that of the coolant channel 172. When assembled, the back 160 cooperates with the front 158 of an adjacent module 122 to provide a ceiling for the coolant channel 172. The power stage 132 may be positioned within the body 156 such that the second plate 152 forms a portion of the outer surface of the back 160. In some embodiments, the second plate 152 may be substantially flush with the outer surface 192 of the back. Used herein, "substantially flush" is to be construed to mean two surfaces are offset by less than or equal to 2 millimeters. This places the second plate 152 directly in contact with the coolant circulating through the coolant channel 172.

The coolant channel 172 may be U-shaped with the first the second ends 174, 176 positioned above the top 138 of the power stage 132, and having a first segment extending from the first end across the power stage 132 to a turn portion located near the bottom 140 of the power stage 132, and a second segment extending from the turn portion to the second end 176. In other embodiments, the channel may be straight, Z-shaped, or W-shaped for example.

Each of the modules 122 may also define a return passageway 194 that extends between the front 158 and the back 160 at an angle that is substantially perpendicular to the front or the back. Each of the return passageways is 194 aligned with each other to create a return conduit extending axially through the stack. The return passageway 194 is optional and is only needed if it is desirable to have the fluid connections for the power-module assembly 120 on the same end plate. In the illustrated embodiment, the first endplate 128 includes an inlet port 200 and an outlet port 202. The ports 200, 202 connect with supply and return lines of the thermal management system. The inlet port 200 may be axially aligned with the coolant receiving area 174 of the first module 124, and the outlet port 202 may be the aligned with the return passageway 194 of the first module 124.

Referring to FIG. 8, the second endplate 130 may define a coolant channel 204 for routing coolant from the exit port 186 of the last module 126 to the return passageway 194 of the last module 126. In embodiments where the return passageway is omitted, the second endplate includes an outlet port aligned with the exit port, and connected to the return line of the thermal management system. The coolant channel 204 includes a floor 210 that is recessed from the outer surface 214 of the second endplate 130, and a sidewall 212 extending between the floor 210 and the outer surface 214. The coolant channels 204 also includes a first end 206 that receives fluid flowing out of the exit port 186 of the last module 126, and a second end 208 disposed adjacent to the return passageway 194 of the last module 126.

Referring to FIGS. 9 through 11B, another power-module assembly 250 includes a plurality of power modules arranged in a stack and sandwiched between a pair of endplates 256, 258. The power-module assembly 250 may include a first set of power modules 252 (A-modules) and second set of power modules 254 (B-modules) that are alternatingly arranged in the stack. The A-modules 252 and the B-modules 254 may have a same footprint and shape, but may have differently shaped coolant channels and/or different passageway locations. The order of the stack may be A, B, A, B, etcetera, along a length of the stack. The stack may end with an A-module or a B-module depending upon the number of modules. In this example, the first module 259 is an A-module, and the last module 261 is also an A-module. Each of the modules includes a power stage 280 that may be similar to the power stage 132 described above.

Each of the A-modules 252 may include body 260 having a front 262, a back 264, a top 266, a bottom 268, and sides 269. Each of the B-modules 254 may include a body 270 having a front 272, a back 274, a top 276, a bottom 278, and sides 279. The bodies may define features that interconnect with adjacent bodies to define a coolant circuit extending through the stack. The illustrated coolant circuit is arranged in series. The first end plate 256 may define an outlet port 255 and an inlet port (not visible) that are connected to supply and return lines of the thermal-management system.

Each of the A-modules 252 may also include a front coolant channel 286 defined in the front 262 and a back coolant channel 298 defined in the back 264. The front channel 286 is recessed from the outer surface 288 of the front 262, and includes a floor 290 and a sidewall 292 extending between the floor 290 and the outer surface 288. The back channel 298 is recessed from the outer surface 304 of the back 264, and includes a floor 300 and a sidewall 302 extending between the floor 300 and the outer surface 304. The power stage 280 may be arranged in the body 260 such that a first plate 282 forms a portion of the floor 290, and a second plate 284 forms a portion of the floor 300 to allow coolant to flow directly across the power stage 280. A first passage 310 is defined by the body 260 and extends between the front 262 and the back 264. The first passage 310 may be located between the top 266 and a top of the power stage 280. The passage 310 includes an entrance port 312 defined in the floor 290 at a second end 296 of the front channel 286, and an exit port 314 defined in the floor 300 at a first end 306 of the back channel 298. The first passage 310 may extend straight through the body 260 such that an axial centerline of the passage 310 is substantially perpendicular to the front and/or the back of the body 260.

Each of the B-modules 254 may also include a front coolant channel 316 defined in the front 272 and a back coolant channel 326 defined in the back 274. The front channel 316 is recessed from the outer surface 336 of the front 272, and includes a floor 322 and a sidewall 324 extending between the floor 322 and the outer surface 336. The back channel 326 is recessed from the outer surface 338 of the back 274, and includes a floor 332 and a sidewall 334 extending between the floor 332 and the outer surface 338. The power stage 280 may be arranged in the body 270 such that the first plate 282 forms a portion of the floor 322, and a second plate 284 forms a portion of the floor 332 to allow coolant to flow directly across the power stage 280. A second passage 340 is defined by the body 270 and extends between the front 272 and the back 274. The second passage 340 may be located between the bottom 278 and a bottom of the power stage 280. The passage 340 includes an entrance port 342 defined in the floor 322 at a second end 320 of the front channel 316, and an exit port 344 defined in the floor 332 at a first end 328 of the back channel 326. The passage 340 may extend straight through the body 270 such that an axial centerline of the passage 340 is substantially perpendicular to the front and/or the back of the body 270. In some embodiments, the A-modules 252 and the B-modules 254 may only include a coolant channel on one side to the module as shown in FIG. 6A for example.

The modules may be stacked such that the front 262 of one of the A-modules 252 is disposed against the back 274 of an adjacent B-module 254, and the back 264 of the A-module is disposed against the front 272 of another adjacent B-module. When stacked, adjacent front and back coolant channels cooperate to form coolant chambers 346 interleaved with the modules. The font and back coolant channels are shaped to align with each other when stacked. For example, the front channel 286 is a mirror image of the back channel 298.

The passages 310 and 340 connect the cooling chambers 346 in fluid communication with each other by providing a fluid conduit extending through the modules. During operation, for example, coolant exits the first cooling chamber 346a via a coolant passage 310a. The exit port 314 of passageway 310a is opposite the receiving area 318 of the front channel 316a. The receiving area does not include a port; forcing coolant to flow generally downwardly across the power stage 280 to the entrance port 342 of the coolant passageway 340a. Coolant then flows through the coolant passageway 340a to the next coolant chamber and so forth down the length of the stack.

The channels, ports, and passageways of the modules may be arranged such that coolant flows in a first direction along the front and in a second direction along the back that is generally opposite the first direction. For example, for each of the A-module 252, coolant generally flows from the top to the bottom along the back 264, and generally flows from the bottom to the top along the front 262. The B-module 254 may be the opposite, with the coolant generally flowing from the top to the bottom along the front 272, and from the bottom to the top along the back 274. Used herein, the term "generally flows" describes the overall flow direction of the coolant as a opposed to an instantons flow direction of individual molecules of the liquid. For example, the coolant flow across the back 264 is generally downward despite the fact the some coolant molecules may flow to the left, to the right, or on a diagonal during their journey from the top inlet port to the bottom outlet port.

In some embodiments, the inlet and outlet ports may be disposed in the same endplate, such as the first endplate 256. When the ports are in the same endplate a return conduit 348 is required to circulate coolant from the last module 261 back to the outlet port, which is disposed on the first endplate 256. The return conduit 348 may be composed of a plurality of return passageways 350. Each of the passageways are defined through the modules and extend between a corresponding front and back. Unlike the other passageways 310, 340, the return passageways 350 may be located at a same location on both the A-modules and the B-modules.

Figure 12:
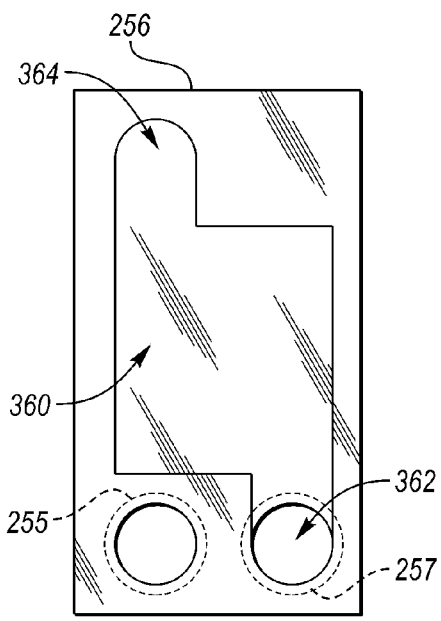
FIG. 12 is a back view of one of the end plates of the assembly of FIG. 9.

Referring to FIG. 12, the first endplate 256 defines a coolant channel 360 that cooperates with the front channel 286 of the first module 259 to define the first cooling chamber 346a. The coolant channel 360 may be recessed into the first endplate similar to the other coolant channels. The coolant channel 360 includes a first end 362 that is aligned with the inlet port 257, and a second end 364 that is aligned with the entrance port 312 of passageway 310a.

Figure 13:
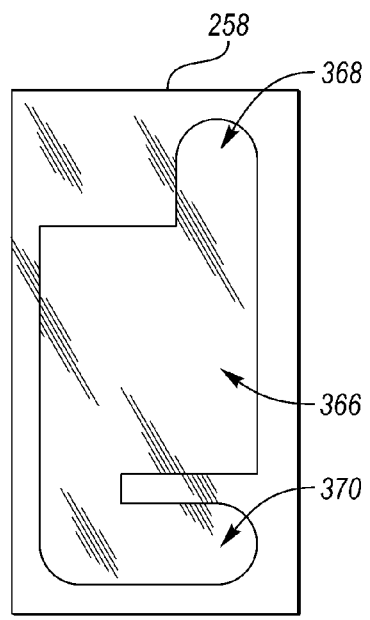
FIG. 13 is a front view of the other of the end plates of the assembly of FIG. 9.

Referring to FIG. 13, the second endplate 258 defines a coolant channel 366 that cooperates with the back channel 298 of the last module 261 to define the last cooling chamber 346b. The coolant channel 366 may be recessed into the second endplate similar to the other coolant channels. The coolant channel 366 includes a first end 368 is aligned with the second end 306 of the back channel 298, and a second end 370 that is aligned with the return conduit 348.

Figure 14:
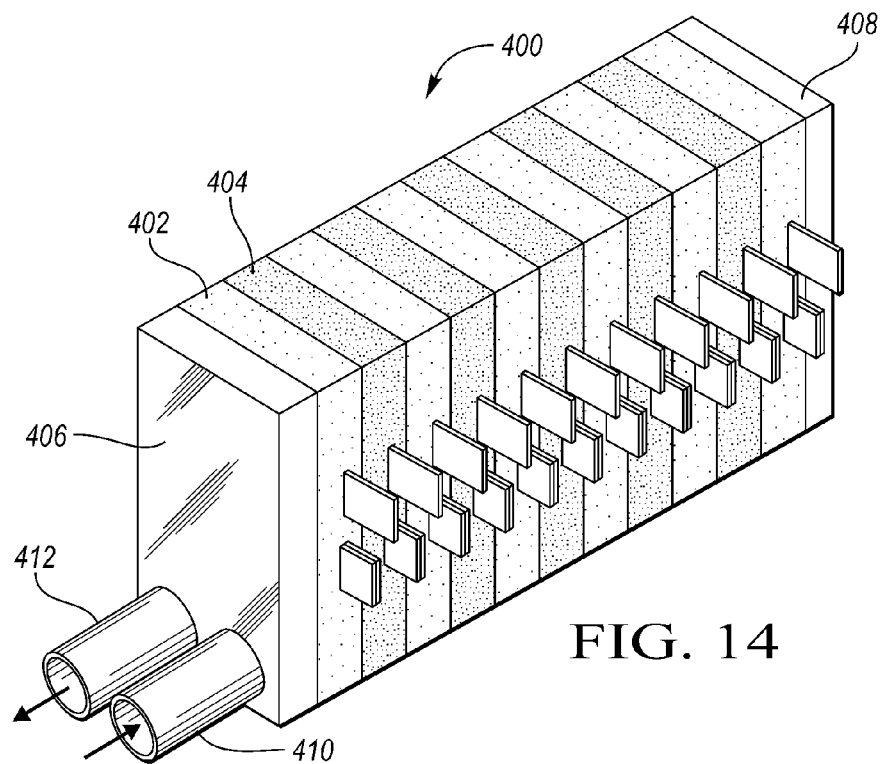
FIG. 14 is a perspective view of yet another power-module assembly.

Referring to FIG. 14, another power-module assembly 400 includes a first set of modules (A-module) 402 and a second set of power modules (B-modules) 404 that are alternatingly arranged along the length of the stack. The first endplate 406 and the second endplate 408 sandwich the stack of modules. One or more of the endplates may include an inlet port 410 and/or an outlet port 412 that connects with the thermal-management system. Each of the modules includes features that cooperate to define a coolant circuit extending through the power-module assembly 400 in order to cool the power stages.

Figure 15:
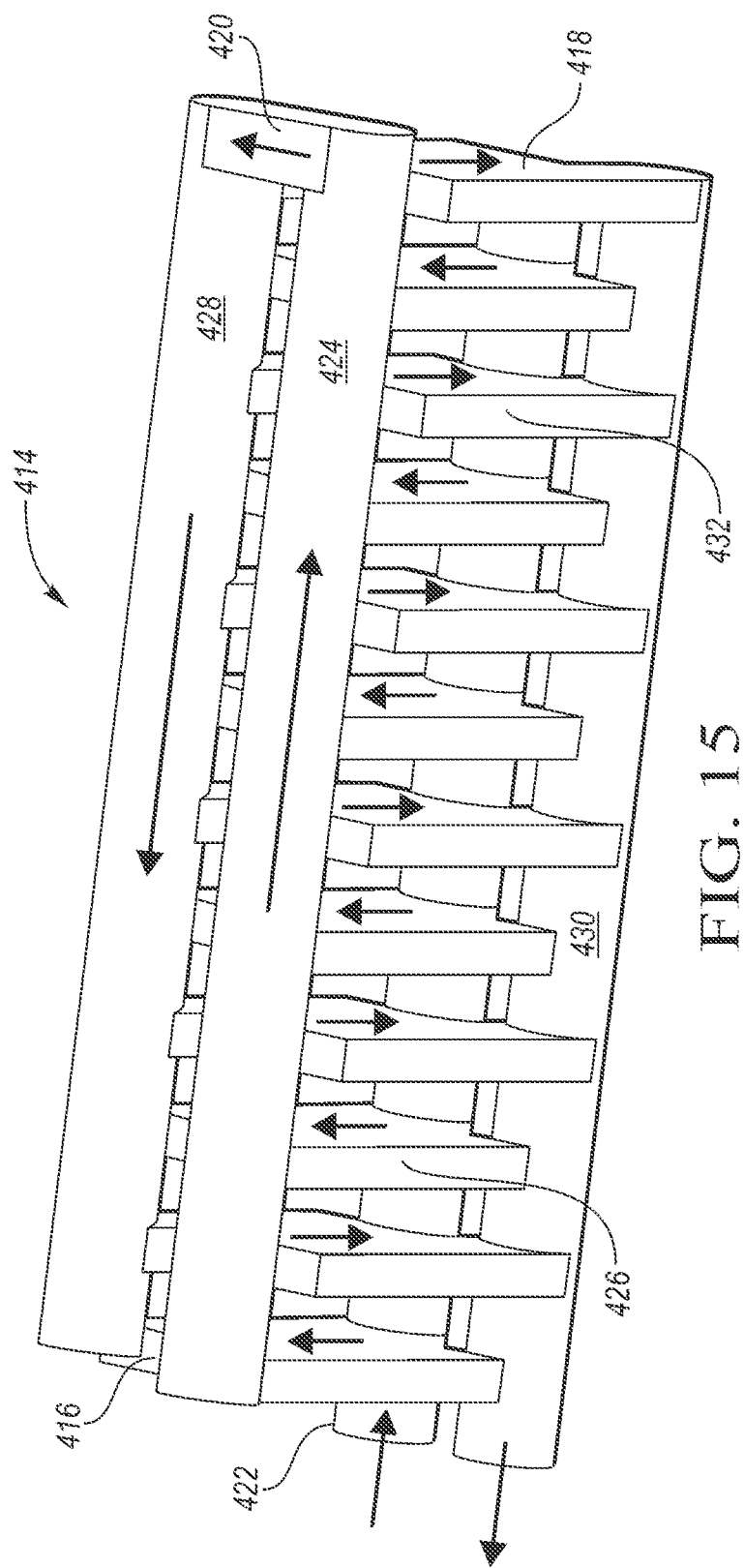
FIG. 15 is a schematic representation of an example coolant circuit of the power-module assembly of FIG. 14.

The coolant circuit may be arranged in a combined parallel-series circuit. A parallel-series circuit is a fluid circuit that includes two or more parallel circuits that are interconnected in series. FIG. 15 shows an example parallel-series circuit 414. FIG. 15 is a schematic representation of the coolant flow through the assembly 400. The lines and chambers shown in FIG. 15 are not actual components disposed within the assembly 400. Rather, the modules of the assembly 400 include passageways and channels that cooperate to define the boundaries of the manifolds and the chambers of the coolant circuit 414 shown in FIG. 15.

The coolant circuit 414 may include a first parallel circuit 416 having a supply manifold 422 and a return manifold 424. The circuit 414 also includes a second parallel circuit 418 including a supply manifold 428 and a return manifold 430. The parallel circuits 416, 418 are connected in fluid communication by interconnecting circuit 420. The interconnecting circuit 420 connects between the return manifold 424 and the supply manifold 428. As described above, the power-module assembly 400 includes a plurality of coolant chambers that are interleaved between adjacent modules to cool the power stages. The first circuit 416 may include first chambers 426 that connect the supply manifold 422 and the return manifold 424 in fluid communication. The second circuit 418 may include second chambers 432 that connect the supply manifold 428 and the return manifold 430 in fluid communication.

The supply manifold 422 may be located near a bottom-left portion of the assembly 400 and the return manifold 424 may be located near a top-right portion of the assembly 400. Thus, coolant flows through the coolant chambers 426 generally in a bottom-to-top direction. The supply manifold 428 may be located near a top-left portion of the assembly 400 and the return manifold 430 may be located near a bottom-right portion of the assembly 400. Thus, coolant flows through the coolant chambers 432 generally in a top-to-bottom direction. In this arrangement, the supply manifold 422, 428 flow in opposite directions relative to each other as do the return manifolds 424, 430. The coolant chambers 426, 432 also flow in generally opposite directions relative to each other. The interconnecting circuit 420 may be disposed on an end of the assembly 400 that is opposite the inlet and outlet ports 410, 412.

Parallel cooling and series cooling have advantages and drawbacks as compared to each other. Parallel is may be preferable when overall pressure drop is a concern. Paralleling the cooling channels results in lower pressure drop. In addition, by carefully design the cooling path, it is possible for all the cooling channels to pass the same amount of coolant at the same time. This allows more uniform cooling of each semiconductor. The drawback of parallel cooling is the relatively low flow rate in each cooling channel. On the other hand, series cooling has a uniform flow rate through all of the cooling channels. But, series cooling circuits typically have a higher overall pressure drop, which is a limiting factor for some systems. The mixed parallel-series cooling strategy takes the advantage of both parallel and series cooling and diminishes the drawbacks. The coolant flow rate in each channel is higher than that of a parallel cooling design and the overall pressure drop is lower than that of a series cooling design.

Figure 16A:
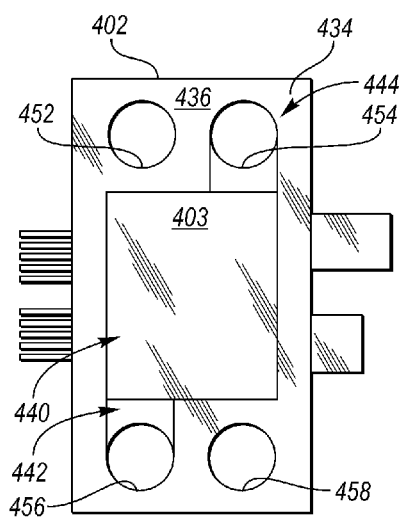
FIG. 16A is a front view of one of power modules of the first set of modules of the assembly of FIG. 14.
Figure 16B:
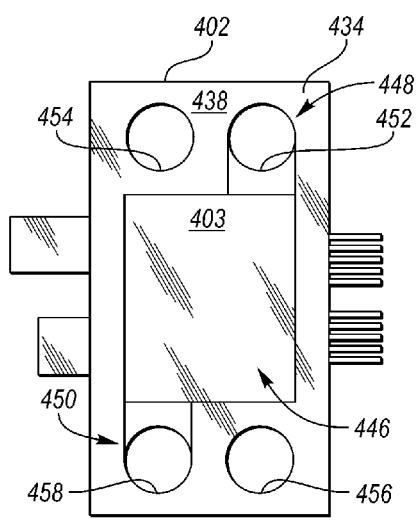
FIG. 16B is a back view of one of power modules of the first set.

Referring to FIGS. 16A and 16B, each of the A-modules 402 may include a body 434 having a front 436 and a back 438. The front 436 may define a front coolant channel 440 that includes a floor recessed from an outer surface of the front. The front coolant channel 440 may include an inlet end 442 connected with the supply manifold 422 and an outlet end 444 connected with the return manifold 424. During operation, coolant flows from the inlet end 442, across the power stage 403 and out the outlet end 444. The back 438 may define a back coolant channel 446 that includes a floor recessed from an outer surface of the back. The back coolant channel 446 may include an inlet end 448 connected with the supply manifold 428 and an outlet end 450 connected with the return manifold 430.

Each of the A-modules 402 may define four passageways (452, 454, 456, and 458) that each extend between the front 436 and the back 438. Passageway 452 forms a segment of the supply manifold 428, passageway 454 forms a segment of the return manifold 424, passageway 456 forms a segment of the supply manifold 422, and passageway 458 forms a segment of the return manifold 430. On the front 436, passageways 454 and 456 are in fluid communication with the front channel 440 such that fluid enters and exits the front channel 440 via the passageways. Passageways 452 and 458 are not in fluid communication with the front channel 440 and coolant does not circulate from those passageways into the channel 440. On the back 438, passageways 452 and 458 are in fluid communication with the back channel 446 such that fluid enters and exits the back channel 446 via the passageways. Passageways 454 and 456 are not in direct fluid communication with the back channel 446 and coolant does not circulate from those passageways into the channel 446.

Figure 17A:
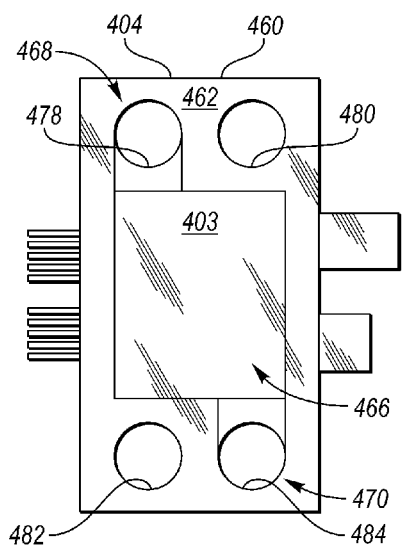
FIG. 17A is a front view of one of power modules of the second set of modules of the assembly of FIG. 14.
Figure 17B:
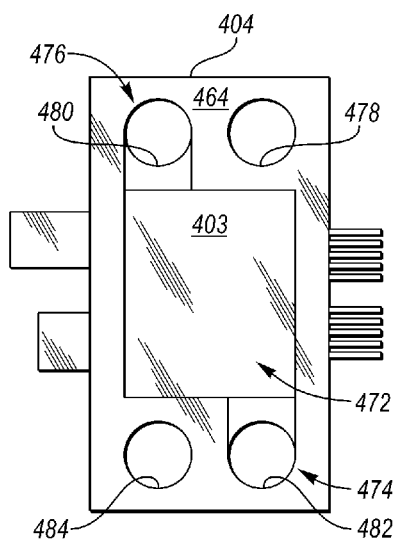
FIG. 17B is a back view of one of power modules of the second set.

Referring to FIGS. 17A and 17B, each of the B-modules 404 may include a body 460 having a front 462 and a back 464. The front 462 may define a front coolant channel 466 that includes a floor recessed from an outer surface of the front. The front coolant channel 466 may include an inlet end 468 connected with the supply manifold 428 and an outlet end 470 connected with the return manifold 430. During operation, coolant flows from the inlet end 468, across the power stage 403 and out the outlet end 470. The back 464 may define a back coolant channel 472 that includes a floor recessed from an outer surface of the back. The back coolant channel 472 may include an inlet end 474 connected with the supply manifold 422 and an outlet end 476 connected with the return manifold 424.

Each of the B-modules 404 may define four passageways (478, 480, 482, and 484) that each extend between the front 462 and the back 464. Passageway 478 forms a segment of the supply manifold 428, passageway 480 forms a segment of the return manifold 424, passageway 482 forms a segment of the supply manifold 422, and passageway 484 forms a segment of the return manifold 430. On the front 462, passageways 478 and 484 are in fluid communication with the front channel 466 such that fluid enters and exits the front channel 466 via the passageways. Passageways 480 and 482 are not in fluid communication with the front channel 466 and coolant does not circulate from those passageways into the channel 466. On the back 464, passageways 480 and 482 are in fluid communication with the back channel 472 such that fluid enters and exits the back channel 472 via the passageways. Passageways 478 and 484 are not in fluid communication with the back channel 472 and coolant does not circulate from those passageways into the channel 472.

Figure 18:
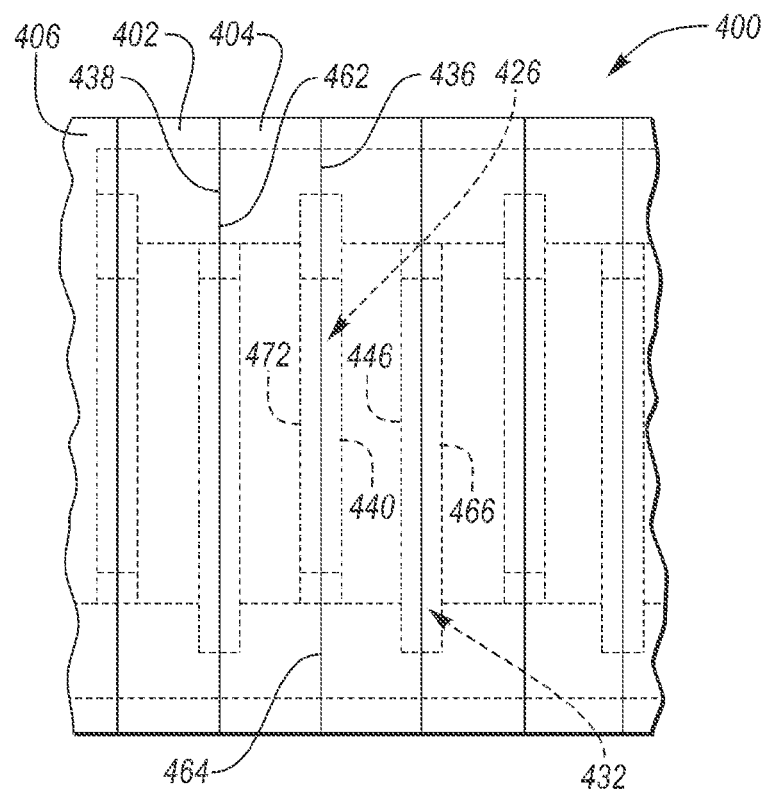
FIG. 18 is a side view of the power-module assembly of FIG. 14.

Referring to FIG. 18, the power modules are arranged in a stack such that the back 438 of the A-modules 402 are disposed against the front 462 of the B-modules 404, and the front 436 of the A-modules 402 are disposed against the back 464 of the B-modules 404. Thus, the front channels 440 cooperate with the back channels 472 to form the coolant chambers 426 of the first parallel circuit 416, and the back channels 446 cooperate with the front channels 466 to form the coolant chambers 432 of the second parallel circuit 418. In this example design, the front channels and the back channels of each module are part of a different parallel circuit. In the illustrated embodiment, for each A-module, the front channels 440 are part of the first parallel circuit 416 and the back channels 446 are part of the second parallel circuit 418; and, for each B-module, the front channels 466 are part of the second parallel circuit 418 and the back channels 472 are part of the first parallel circuit 416.

Figure 19:
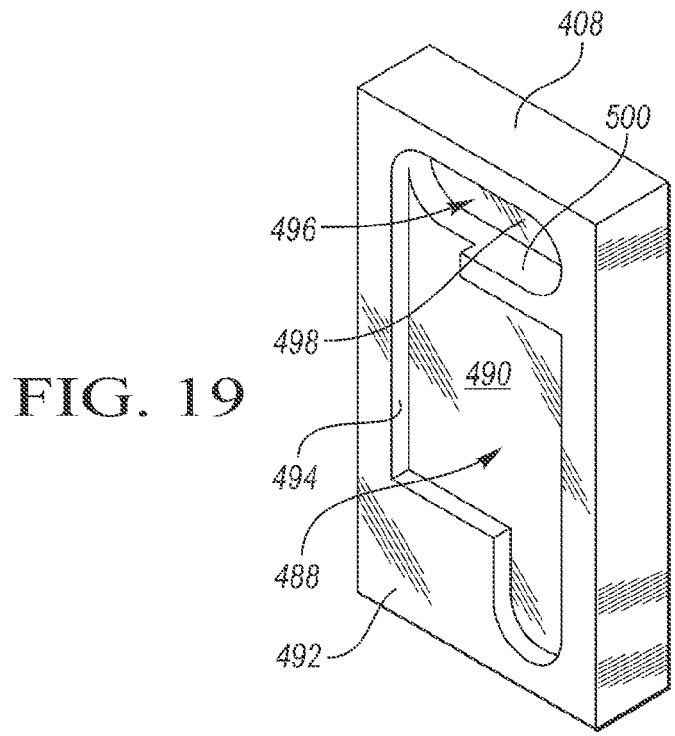
FIG. 19 is a perspective view of an end plate of the power-module assembly of FIG. 14.

Referring to FIG. 19, the second endplate 408 may define a shallow channel 488 that cooperates with the adjacent back channel 446—of the last A-module of the stack—to define the first coolant chamber 432 of the second parallel circuit 418. The shallow channel 488 may include a floor 490 that is recessed from the outer surface 492 of the endplate. As sidewall 494 extends between the outer surface 492 and the floor 490. The endplate 408 may also include a deep channel 496 that defines the interconnecting circuit 420. The deep channel 496 is recessed further into the endplate than the shallow channel 488. The deep channel 496 may include a floor 498 and a sidewall 500. Portions of the sidewall 500 extend between the floor 490 and the floor 498, and other portions extend between the outer surface 492 of the endplate and the floor 498. The first endplate 406 may also include a coolant channel that cooperates with the front channel 440 of the first module to define the first coolant chamber 426 of the first parallel circuit 416.

While example embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A power-electronics assembly comprising:
   a plurality of power modules each including
      a power stage having opposing major sides,
      a body encasing the power stage and having front and back sides,
      a coolant channel recessed into the front side at a location adjacent to one of the major sides and including a receiving end and an exit end, and
      a crossover passageway extending through the body and having an inlet port located at the exit end and an outlet port defined in the back side and axially offset to the inlet port to be located in alignment with the receiving end such that the crossover passageway extends between the inlet port and the outlet port at an oblique angle relative to the front side; wherein
   the power modules are arranged in a linear stack such that the front and back sides of adjacent power modules are disposed against each other, the coolant channels are interleaved with the power stages, and the crossover passageways connects adjacent coolant channels in fluid communication to form a series coolant circuit extending through the stack.

2. The power-electronics assembly of claim 1 wherein the coolant channels are U-shaped.

3. The power-electronics assembly of claim 1 wherein, for each power module, the coolant channel includes a floor and at least one sidewall extending between the floor and an outer surface of the front side, and wherein the inlet port is defined by the floor.

4. The power-electronics assembly of claim 1 wherein the inlet port is disposed on one side of a longitudinal centerline of the body and the outlet port is disposed on the other side of the longitudinal centerline.

5. The power-electronics assembly of claim 1 wherein the inlet port is disposed on one side of a latitudinal centerline of the body and the outlet port is disposed on the other side of the latitudinal centerline.

6. The power-electronics assembly of claim 1 wherein each of the coolant channels includes a floor recessed into the body such that one of the major sides of the power stage forms a portion of the floor allowing coolant to be circulated directly across the power stage.

7. The power-electronics assembly of claim 1 further comprising:
   a capacitor bank electrically connected to each of the power stages; and
   a gate drive board electrically connected to each of the power stages.

8. An apparatus comprising:
   power modules each including a power stage encased in a frame having a back and a front, that defines a fluid channel having a floor defining a first port connected to a second port, axially offset to the first port and defined in the back, via a passageway outside of a footprint of the power stage and extending through a thickness of the frame at an oblique angle relative to the front.

9. The apparatus of claim 8 wherein the power modules are arranged in a stack with a front of one of the power modules
   disposed against a back of an adjacent one of the power modules.

10. The apparatus of claim 8 wherein each of the power modules further defines a second passageway extending between
   the front and the back, wherein the second passageway is not in direct fluid communication with the fluid channels.

11. The apparatus of claim 8 wherein each of the power stages further includes a major side that forms at least a portion of the floor of a corresponding one of the fluid channels allowing coolant to be circulated directly across the major side.

12. The apparatus of claim 8 further comprising:
   a capacitor bank electrically connected to each of the power stages; and
   a gate drive board electrically connected to each of the power stages.

13. A power-module assembly comprising:
   a stack of first and second sets of power modules alternatingly arranged, each module of the sets including a power stage encased in a body having a front defining a front coolant channel, a back defining a back coolant channel, and four passageways extending between the front and the back, wherein two of the four passageways are in fluid communication with the front coolant channel and the other two of the four passageways are in fluid communication with the back coolant channel, and wherein the back coolant channels cooperate with the front coolant channels to define coolant chambers, and the front coolant channels of the first and second sets are mirror images of each other.

14. The power-module assembly of claim 13 wherein the front coolant channels are recessed into the front of a corresponding one of the power modules and includes a floor and sidewalls extending between the front and the floor, and back coolant channels are recessed into the back of a corresponding one of the power modules and includes a floor and sidewalls extending between the back and the floor.

15. The power-module assembly of claim 13 wherein, for each power module, two of the four passageways are disposed between a top of the power stage and a top of the power module, and the other two of the four passageways are disposed between a bottom of the power stage and a bottom of the power module.

16. The power-module assembly of claim 13 wherein the passageways of the bodies align with each other to form four manifolds extending along a length of the stack and through each of the power modules, and wherein two of the manifolds are supply manifolds and the other two of the manifolds are return manifolds.

17. The power-module assembly of claim 16 wherein the front coolant channels of the first set of power modules are in direct fluid communication with one of the supply manifolds and one of the return manifolds, and the second set of power modules are in direct fluid communication with the other of the supply manifolds and the other of the return manifolds.

18. The power-module assembly of claim 13 wherein each of the power modules of the first and second sets includes opposing first and second portions, and each of the front coolant channels of the first power modules is configured to circulate coolant from the first portion to the second portion, and each of the front coolant channels of the second power modules is configured to circulate coolant from the second portion to the first portion.

19. The power-module assembly of claim 18 wherein each of the back coolant channels of the first power modules is configured to circulate coolant from the second portion to the first portion, and each of the back coolant channels of the second power modules is configured to circulate coolant from the first portion to the second portion.

* * * * *